United States Patent
Nishida (10) Patent No.: US 6,609,160 B1
(45) Date of Patent: Aug. 19, 2003

(54) SELECTOR WITH GROUP IDENTIFICATION TERMINALS

(75) Inventor: Shinsuke Nishida, Tokyo (JP)

(73) Assignee: Fourie, Inc., Tokyo (JP)

(*) Notice: Subject to any disclaimer, the term of this patent is extended or adjusted under 35 U.S.C. 154(b) by 0 days.

(21) Appl. No.: 09/533,950

(22) Filed: Mar. 23, 2000

(30) Foreign Application Priority Data

Mar. 26, 1999 (JP) .......................................... 11-084019

(51) Int. Cl.[7] .............................. G06F 3/00; G11C 8/10
(52) U.S. Cl. ..................... 710/3; 710/38; 365/230.06; 365/230.02
(58) Field of Search .......................... 34/418, 520, 531, 34/567, 571, 903; 711/100; 365/230.02, 230.06; 710/3, 38, 36

(56) References Cited

U.S. PATENT DOCUMENTS 4,833,542 A * 5/1989 Hara et al. ................... 345/903
5,267,212 A * 11/1993 Takashima ............. 365/230.06
6,271,806 B1 * 8/2001 Motoshima et al. ........ 345/418

OTHER PUBLICATIONS

Kunio Inukai, "Latest TTLIC Standard List, 1979 Edition", edited by Kunio Inukai, published by CQ Publishing Co., Ltd., p. 124.

* cited by examiner

*Primary Examiner*—Jeffrey Gaffin
*Assistant Examiner*—Joshua D Schneider
(74) *Attorney, Agent, or Firm*—Sughrue Mion, PLLC (57) ABSTRACT

The selector receives group identification signals which specify any number of divisions for elements to be grouped and address signals that specify one of the divided groups. The groups are then obtained based on the number of divisions specified with the group identification signals. The selector further selects selector-output terminals within a group, of the groups, that is specified with the address signals. The effective selector-output signals are then output from the selected selector-output terminals.

6 Claims, 7 Drawing Sheets

PRIOR ART

FIG.7

SELECTOR WITH GROUP IDENTIFICATION TERMINALS

FIELD OF THE INVENTION

The present invention relates to a selector which selects one particular output terminal out of a plurality of output terminals based on address signals that are input into a plurality of address terminals. More particularly, this invention relates to a selector which selects a plurality of output terminals in a specific group and outputs effective signals from the selected output terminals.

BACKGROUND OF THE INVENTION

Figure 7:
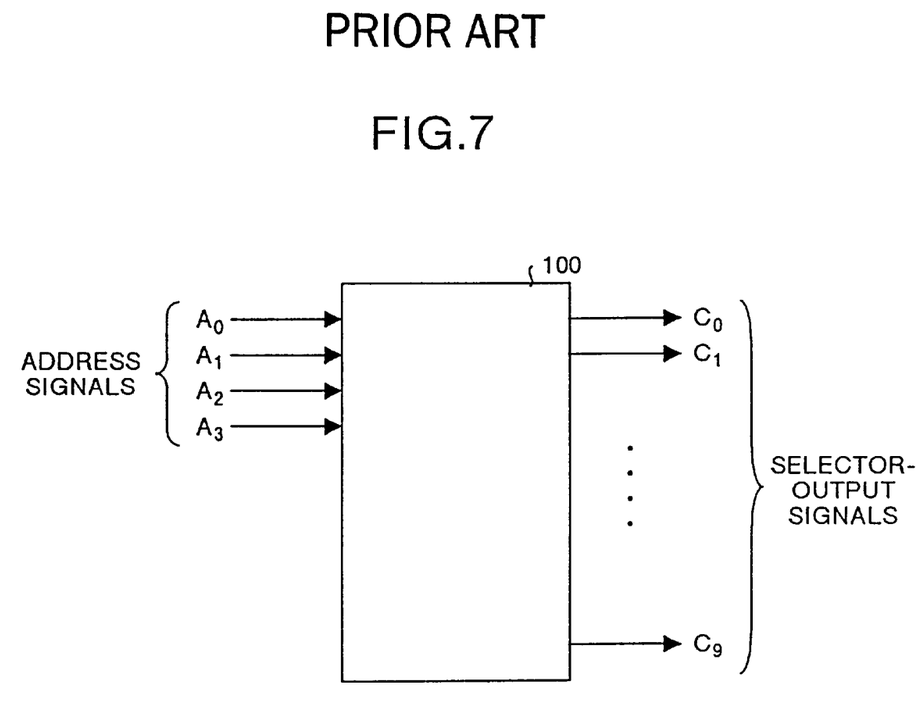
FIG. 7 shows the conventional type of selector.

FIG. 7 shows a conventional type of selector. Selector 100 shown in FIG. 7 has a plurality of address terminals and a plurality of selector-output terminals. The selector 100 outputs an effective signal from only one of the plurality of selector-output terminals based on the address signal input from the address terminals. This figure shows an example in which address signals $A_0$ to $A_3$ are input into the selector 100 from four address terminals and one of the selector-output signals $C_0$ to $C_9$ that are output from 10 selector-output terminals is selected as an effective signal.

The selector 100 shown in FIG. 7 is often used especially as a decoder such as a BCD (binary-coded decimal) decoder. There exists a relation such that the number of address terminals is less than the number of selector-output terminals. This relation generally holds in other decoders also. In the example shown in FIG. 7, the BCD code consisting of 4 bits is set as the address signals $A_0$ to $A_3$ and numerical values of 0 to 9 which represent the decimal numbers are assigned to the selector-output signals $C_0$ to $C_9$, respectively.

Let us consider a specific example. When "0101" are input as the address signals $A_0$ to $A_3$, only the selector-output signal $C_5$ is output as a signal having a logical level of "L". All of the other selector-output signals $C_0$ to $C_4$ and $C_6$ to $C_9$ are output as signals having a logical level of "H". Thus, it is possible to select, by using a small number of address terminals, one of the selector-output terminals that are formed with a larger number of terminals as compared to the number of address terminals, and output an effective signal from the terminal.

The selector 100 may be used as address decoder in memory management of a CPU. In this case, the address decoder receives an address signal from the CPU in order to identify one of the plurality of memory cells which are arranged in a matrix. The address decoder then selects a word line in the row direction and a bit line in the column direction to identify the location of the memory cell based on the address indicated by this address signal. Further, the address decoder outputs effective signals to these lines. Writing or reading data in or from the memory cell in its effective state is then performed via a sense amplifier or an I/O port.

Such selector (or decoder), however, selects only one of the plurality of selector-output signals in response to input of the address signal, and outputs the selected signal as effective signal. Therefore, when it is desired to output effective signals to some of the plurality of selector-output terminals, it is required to identify addresses one by one.

Especially, when the selector is used as the address decoder as mentioned above, the address decoder has such restriction that only a pair of word line and bit line can be selected for one address. Therefore, when it is desired to write the same data in a plurality of memory cells, it is required to prepare addresses one by one to identify each of these memory cells.

In this case, the processing of writing data becomes redundant, and such redundant processing wastefully occupies the CPU for a long period of time. Not only is the processing for other tasks affected by this wasteful occupation, but also there occurs such a problem that the program for memory to be executed by the operating system becomes complicated.

In addition, the conventional type of selector 100 further requires some other device such as a driver IC when it is desired to acquire a plurality of effective signals for one address.

SUMMARY OF THE INVENTION

It is an object of this invention to provide a selector which can select and output a plurality of effective signals at a time.

The selector according to one aspect of this invention comprises a plurality of selector-output terminals that are objects to be selected and a plurality of address terminals that select these selector-output terminals. The selector further comprises a plurality of group identification terminals that divide the selector-output terminals into groups, and enable selection of the selector-output terminals in each group. Therefore, it is possible to output effective signals from a plurality of selector-output terminals at a time based on the address signals that are input into the address terminals and the group identification signals that are input into the group identification terminals.

The selector according to another aspect of this invention comprises a plurality of selector-output terminals that are objects to be selected and a plurality of address terminals that select these selector-output terminals. The selector further comprises a plurality of group identification terminals that divide the selector-output terminals into groups, and enable selection of the selector-output terminals in each group. In addition, there is provided a selection output terminal that outputs a selection signal to discriminate between selector-output signals that are output from the selector-output terminal. Therefore, it is possible to select one or any group of a larger number of objects to be selected by making effective use of the limited number of selector-output terminals.

Other objects and features of this invention will become apparent from the following description with reference to the accompanying drawings.

DESCRIPTION OF THE PREFERRED EMBODIMENTS

Embodiments of the selector according to the present invention are explained in detail below with reference to the attached drawings. It is understood that this invention is not restricted by these embodiments.

Figure 1:
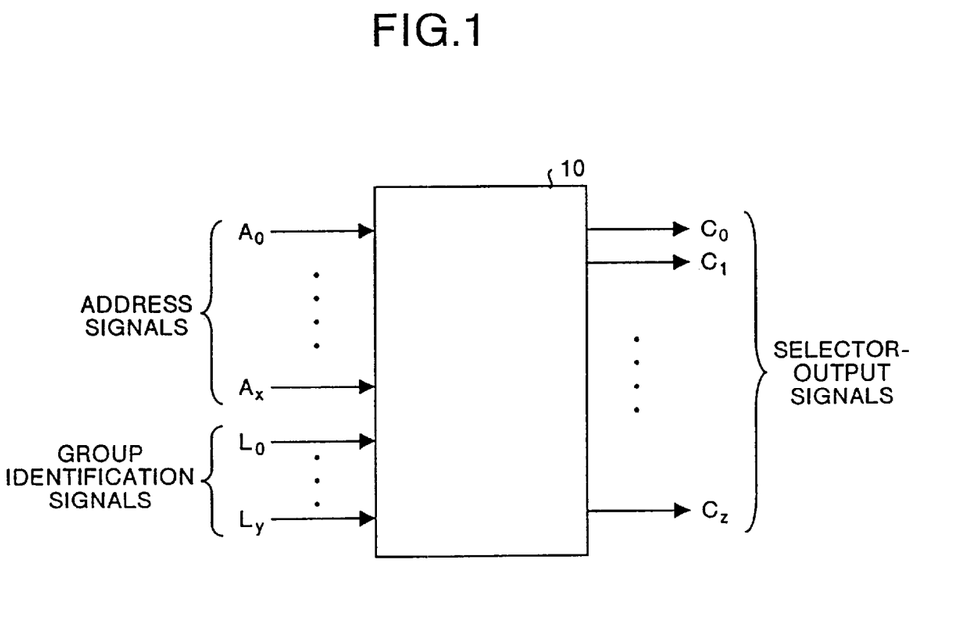
FIG. 1 shows a selector according to a first embodiment.

FIG. 1 shows a selector according to a first embodiment. Selector 10 according to the first embodiment comprises a plurality of address terminals that receive address signals, and a plurality of selector-output terminals. The selector 10 further comprises a plurality of group identification terminals that receive group identification signals indicating a group to be grouped.

In FIG. 1, reference signs $L_0$ to $L_y$ represent the group identification signals which are input from the outside. These input signals are used when a plurality of selector-output terminals are divided into groups and address bits to be effective of the input address signals are determined, as explained later. In other words, the group identification signals $L_0$ to $L_y$ are the signals that specify in how many groups the selector-output terminals are to be divided into. More specifically, the group identification signals $L_0$ to $L_y$ consist of a plurality of bits and are represented here as 2 bits. In this case, y=1, and one of 0 to 3 can be specified as a group identification signal.

$A_0$ to $A_x$ represent the address signals, which are input from the outside. Each of these input signals specifies one of the groups of the selector-output terminals which are divided based on any group identification signal indicated by the group identification signals $L_0$ to $L_y$. The address signals $A_0$ to $A_x$ consist of a plurality of bits and are represented here as 4 bits. In this case, x=3, thus one out of maximum $2^4$ number of selector-output terminal can be identified.

Reference signs $C_0$ to $C_z$ represent selector-output signals, which are output from the selector in response to identification of the plurality of selector-output terminals, respectively. The selector-output signals are represented as 16 signals, which are independent from one another (in this case, z=15). Accordingly, of the selector-output signals $C_0$ to $C_z$, only the bits that are identified by the group identification signals $L_0$ to $L_y$ and the address signals $A_0$ to $A_x$ are output as effective signals.

For instance, it is specified to group the selector-output terminals in four-way division mode based on the group identification signals $L_0$ to $L_y$. In this case, the address signals $A_0$ to $A_x$ specify one of these four groups. The signals in the logical level "L" are output from any selector-output terminals included in the specified group. Whereas the signals in the logic level "H" are output from the other selector-output terminals which are not specified, respectively. In this case, the effective signal indicates the signal having the logic level "L".

Figure 2:
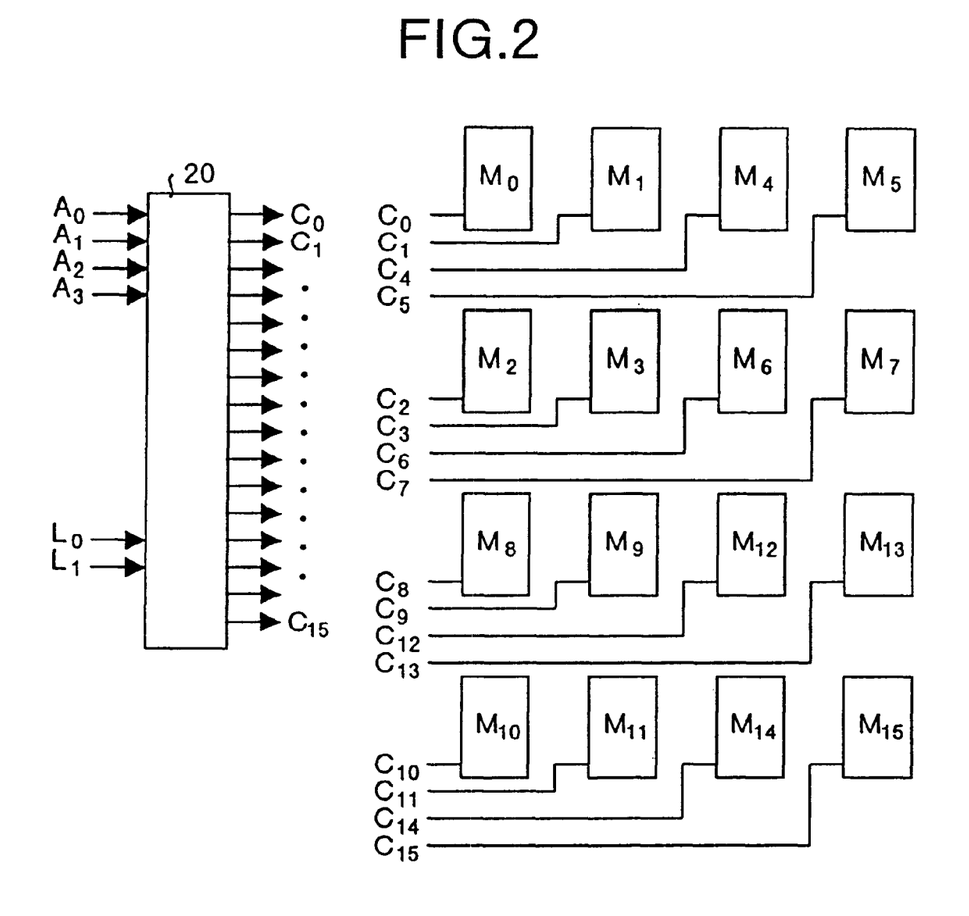
FIG. 2 shows an example of application of the selector according to the first embodiment.

FIG. 2 shows an example of application of the selector according to the first embodiment. This figure shows an example in which the address signals $A_0$ to $A_x$ consist of 4 bits (x=3), the group identification signals $L_0$ to $L_y$ consist of 2 bits (y=1), and a selector 20 consists of 16 selector-output signals $C_0$ to $C_z$ (z=15). The case in which this selector 20 is used to select one among 16 memory cells $M_0$ to $M_{15}$ is explained.

In this case, the selector-output terminals can be divided based on four types of division mode such as "not-divided", "four-way division", "16-way division", and "64-way division" using the group identification signals $L_0$ and $L_1$. These four types of division mode can be correlated to the group identification signals each of which consists of 2 bits, such as "00" (specify Division 0), "01" (specify Division 1), "10" (specify Division 2), and "11" (specify Division 3). In this case, however, there are 16 units of selector-output terminal as objects to be selected. Therefore, "64-way division", namely specifying the group identification signal "11" is invalid.

Figure 3:
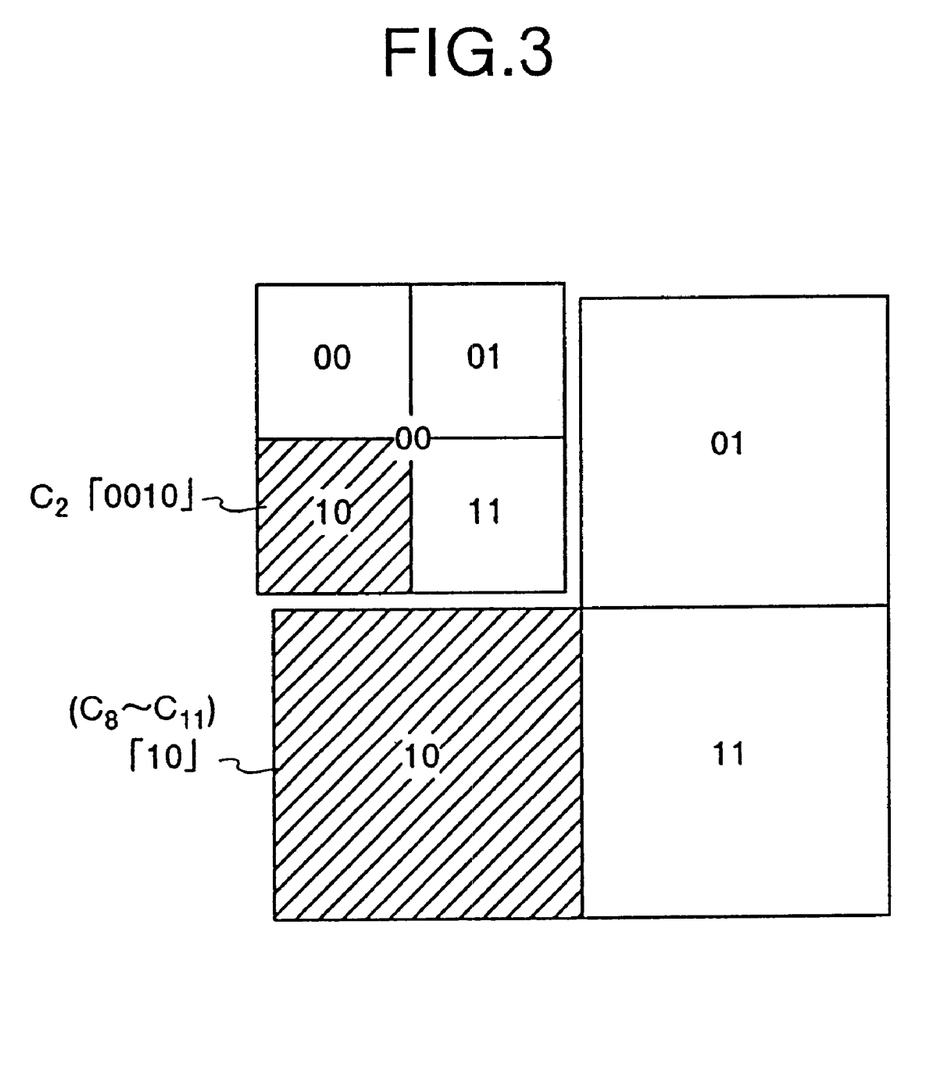
FIG. 3 shows a correlation between groups of selector-output terminals which are divided based on group identification signals and addresses indicated by address signals.

The example of these division modes is explained below. FIG. 3 shows a correlation between the groups of selector-output terminals which are divided based on the group identification signals and the addresses indicated by the address signals. In order to facilitate the understanding of the division modes for the 16 selector-output terminals, a 4 by 4 matrix is shown in FIG. 3, in which one of the minimum cells corresponds to one selector-output terminal.

The address to be assigned to one selector-output terminal is determined as follows. As shown in FIG. 3, selector-output terminals sixteen in number are grouped into four areas. Namely, the selector-output terminals are divided into groups each of which is represented as a 2 by 2 matrix. The 2-bit codes of "00", "01", "10, and "11" are then assigned to the divided four areas in order of those located in the left upper side, the right upper side, the left lower side, and the right lower side. For example, the groups of ($C_0$ to $C_3$), ($C_4$ to $C_7$), ($C_8$ to $C_{11}$), and ($C_{12}$ to $C_{15}$) in the 16 units of selector-output terminal are correlated to "00", "01", "10", and "11", respectively.

Each of the divided groups is further divided into four areas. In other words, the sixteen selector-output terminals are represented as 4 by 4 groups at this stage. Further, 2-bit codes are assigned to these divided groups as explained above. Some other division mode such that the selector-output terminals are divided only in the vertical direction may be employed in addition to the divisions shown in FIG. 3.

If the codes assigned to the groups which indicate larger areas are defined as higher-order bits, the reference sign $C_2$ (which represents the selector-output terminal that outputs the selector-output signal $C_2$) in FIG. 3 can be represented as "0010". Whereas the group ($C_8$ to $C_{11}$) of the selector-output signals can be represented as "10". Any group as a minimum unit of a matrix, or any group (higher-order group) that is formed with a plurality of the groups as the minimum units can be identified with a bit code.

The case where the group identification signals $L_0$ and $L_1$ represent "00" in FIG. 2 indicates that the selector-output terminals are "not divided". Therefore, the 4-bit addresses of the address signals $A_0$ to $A_3$ have no meanings any more, and then all the selector-output terminals are selected. Namely, all the selector-output signals $C_0$ to $C_{15}$ are output as effective signals (e.g., the logic level "L"), and all the memory cells $M_0$ to $M_{15}$ are then selected.

The case where the group identification signals $L_0$ and $L_1$ represent "01" indicates "four-way division". The selector-output terminals are then divided into four groups: ($C_0$ to $C_3$), ($C_4$ to $C_7$), ($C_8$ to $C_{11}$), and ($C_{12}$ to $C_{15}$), which correspond to the selector-output signals output from the terminals. Therefore, the higher-order 2 bits (e.g., address signals $A_0$ and $A_1$) of the 4-bit address of the address signals $A_0$ to $A_3$ become effective. Hence one of the four groups can be selected based on these effective address bits. When the address signals $A_0$ to $A_3$ represent "1000", "00" as the lower-order 2 bits are ignored. Accordingly, the selector-output terminals corresponding to the group ($C_8$ to $C_{11}$) are selected based on "10" which are the higher-order 2 bits as shown in FIG. 3. Namely, only the selector-output signals $C_8$ to $C_{11}$ are output as effective signals (e.g., the logical level "L"), and then the memory cells $M_8$ to $M_{11}$ are selected.

The case where the group identification signals $L_0$ and $L_1$ represent "10" indicates "16-way division", and the selector-output terminals are then divided into 16 groups. Since there are 16 units of selector-output terminal in this example, one of the terminals is selected. The corresponding address bits of the address signals $A_0$ to $A_3$ are then effective. Therefore, one of the 16 units of selector-output terminal can be selected based on these effective address bits. When the address signals $A_0$ to $A_3$ represent "0010", for example, the selector-output terminal that outputs the selector-output signal $C_2$ is selected as shown in FIG. 3. Namely, only the selector-output signal $C_2$ is output as an effective signal (e.g., the logic level "L"), and then the memory cell $M_2$ is selected.

As explained above, the selector 20 selects a plurality of selector-output signals, of the selector-output signals $C_0$ to $C_{15}$, which are divided into groups based on the input group identification signals $L_0$ and $L_1$ and the address signals $A_0$ to $A_3$. Accordingly, the selector 20 can output the selected selector-output signals as effective signals.

Although the object to be selected by the selector 20 is memory cells in the explanation related to FIG. 2, the object may be any assembly of other function elements. For example, in any assembly obtained by arranging a plurality of display elements such as electric bulbs or LEDs, the elements may be selected in groups as explained above.

According to the selectors 10 and 20 based on the first embodiment, as understood from the explanation above, each of the selectors has a plurality of selector-output terminals which are objects to be selected and a plurality of address terminals to select these selector-output terminals. In addition, the selector has a plurality of group identification terminals to enable selection of each of the groups into which the selector-output terminals are divided. Therefore, many effective signals can be output at one time from the plurality of selector-output terminals based on the address signals $A_0$ to $A_3$ that are input to the address terminals and the group identification signals $L_0$ to $L_y$ that are input to the group identification terminals. Accordingly, the signals indicating a group can selectively and concurrently be output from a plurality of output terminals only by specifying one address. Thus, the load on a controller (such as a CPU) that gives signals to the selector can be reduced in the system which has this selector. Further, the throughput of the entire system can be improved.

Figure 4:
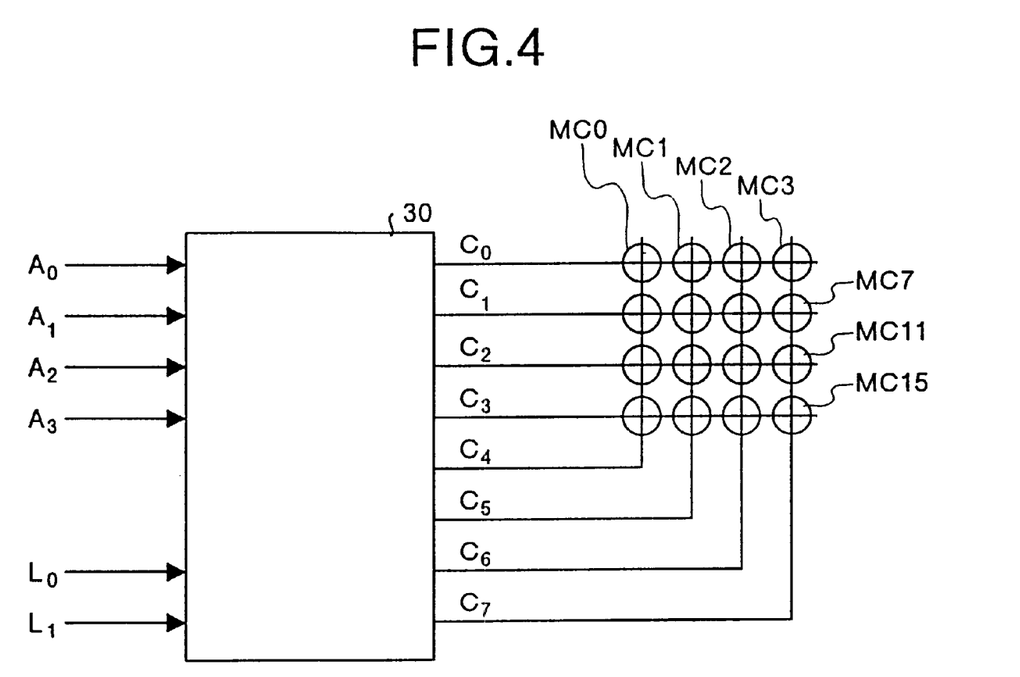
FIG. 4 shows a selector and a structure of memory cells in a matrix according to a second embodiment.

A selector according to a second embodiment is explained below. In this second embodiment, a case where the selector 10 shown in FIG. 1 is used as an address decoder in the structure of memory cells in a matrix is explained. FIG. 4 shows a selector 30 and a structure of memory cells in a matrix used in this case.

The selector 30 shown in FIG. 4 has four address terminals to which address signals $A_0$ to $A_3$ that consist of 4 bits are input, and two group identification terminals to which group identification signals $L_0$ and $L_1$ that consist of 2 bits are input. Further, the selector 30 has eight selector-output terminals from which selector-output signals $C_0$ to $C_7$ are output. Some of 4 by 4 memory cells MC0 to MC15 are selected based on these selector-output signals $C_0$ to $C_7$.

The configuration that consists of the selector 30 and a plurality of memory cells arranged in a matrix shown in FIG. 4 is different from the configuration in FIG. 2. The different point in FIG. 4 is that each of the memory cells can be identified by selecting a word line in the row direction and a bit line in the column direction. As shown in FIG. 4, at least one of four word lines is selected based on four selector-output signals $C_0$ to $C_3$. Further, at least one of four bit lines is selected based on four selector-output signals $C_4$ to $C_7$. For example, the memory cell $MC_7$ is selected when the selector-output signals $C_1$ and $C_7$ are output as effective signals. In order to select any of the memory cell, two selector-output signals corresponding to the word line and the bit line indicating the cell are required.

The address signals and the group identification signals in this selector 30 can also easily be handled through the division modes and assignment of addresses to each of the divided areas as shown in FIG. 3. However, when this method is applied to the selector 30, it is preferable to decide any address to be assigned to one selector-output terminal in consideration of the arrangement of the memory cells MC0 to MC15. The details are explained as follows.

The memory cells MC0 to MC15 arranged in a matrix are grouped to four areas as shown in FIG. 3. Namely, the memory cells MC0 to MC15 are divided into groups each of which is represented as a 2 by 2 matrix. 2-bit codes "00", "01", "10", and "11" are assigned to the divided four areas in order of those located in the left upper side, the right upper side, the left lower side, and the right lower side. For example, the groups of (MC0, MC1, MC4, MC5), (MC2, MC3, MC6, MC7), (MC8, MC9, MC12, MC13), and (MC10, MC11, MC14, MC15) in the 16 memory cells MC0 to MC15 are correlated to "00", "01", "10", and "11", respectively.

Each of the divided groups is further divided into four areas. Namely, the 16 memory cells MC0 to MC15 are represented as 4 by 4 groups in this stage. Further, the 2-bit codes are assigned to these divided groups as explained above. As explained in FIG. 3, the codes assigned to the groups which indicate the larger areas are defined as higher-order bits The selector-output signals to identify the memory cells that are grouped as explained above are then determined. Namely, the selector-output signals ($C_0$, $C_1$, $C_4$, $C_5$) are correlated to the group (MC0, MC1, MC4, MC5), the selector-output signals ($C_0$, $C_1$, $C_6$, $C_7$) are correlated to the group (MC2, MC3, MC6, MC7), the selector-output signals ($C_2$, $C_3$, $C_4$, $C_5$) are correlated to the group (MC8, MC9, MC12, MC13), and the selector-output signals ($C_2$, $C_3$, $C_6$, $C_7$) are correlated to the group (MC10, MC11, MC14, MC15).

Especially in the structure of the memory cells shown in FIG. 4, which is different from the structure of the memory cells shown in FIG. 2, one of the 16 memory cells MC0 to MC15 is identified by using any of the eight selector-output terminals. Therefore, two selector-output signals are required to specify one memory cell. Hence a minimum state to be selected, which is identified based on the address signals $A_0$ to $A_3$, is a group formed with two pairs of the selector-output terminals.

The division modes are explained using the selectoroutput signals $C_0$ to $C_7$. There is a case where the group identification signals $L_0$ and $L_1$ that represent "00" are input into the selector 30. This case indicates that the memory cells are "not divided", therefore, all the selector-output terminals can be selected. Namely, all the selector-output signals $C_0$ to $C_7$ are output as effective signals (e.g., logical level "L"), and all the memory cells MC0 to MC15 are then selected.

There is another case where the group identification signals $L_0$ and $L_1$ that represent "01" are input into the selector 30. This case indicates "four-way division" of the memory cells. The selector-output terminals are then divided into four groups: ($C_0$, $C_1$, $C_4$, $C_5$), ($C_0$, $C_1$, $C_6$, $C_7$), ($C_2$, $C_3$, $C_4$, $C_5$), and ($C_2$, $C_3$, $C_6$, $C_7$) which correspond to the selector-output signals output from the terminals, respectively. The higher-order 2 bits (e.g., address signals $A_0$ and $A_1$) in the 4-bit address of the address signals $A_0$ to $A_3$ become effective, and then one of the four groups can be selected based on these 2 address bits. When the address signals $A_0$ to $A_3$ represent "1000", the code "00" as the lower-order 2 bits is ignored. Hence the selector-output terminals corresponding to the group ($C_2$, $C_3$, $C_4$, $C_5$) are selected based on "10" as the higher-order 2 bits. Namely, only the selector-output signals $C_2$, $C_3$, $C_4$, and $C_5$ are output as effective signals (e.g., logic level "L"), and the memory cells MC8, MC9, MC12, and MC13 are then selected.

Further, there is another case where the group identification signals $L_0$ and $L_1$ that represent "10" are input into the selector 30. This case indicates "16-way division" of the memory cells, and the selector-output terminals are divided into 16 groups. In this case, each of the groups consists of two selector-output terminals. The higher-order 4 bits in the 4-bit address of the address signals $A_0$ to $A_3$, namely all the address bits become effective. Hence one of the eight pairs of selector-output terminals can be selected based on these address bits. When the address signals $A_0$ to $A_3$ represent "0001", only the selector-output signals $C_0$ and $C_5$ are output as effective signals (e.g., logic level "L"), and the memory cell MC1 is then selected.

Figure 5:
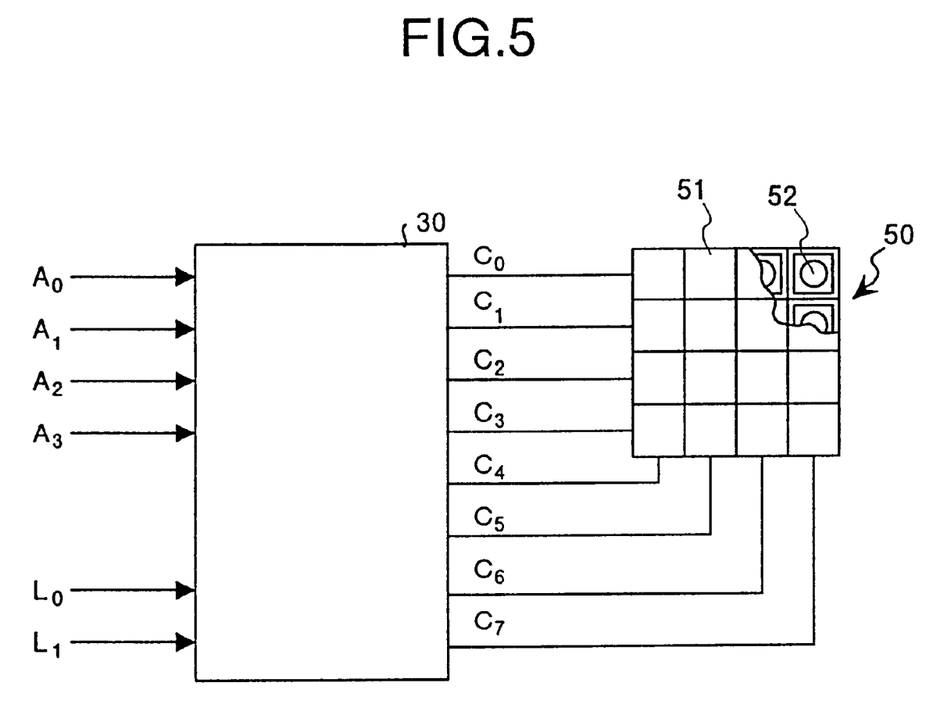
FIG. 5 shows the selector and a matrix-formed display panel according to the second embodiment.

It is assumed in the explanation related to FIG. 4 that the object to be selected by the selector 30 are the memory cells that are arranged in a matrix form. However, any device in which other function elements are assembled in a matrix may be the object. As shown in FIG. 5, display units 51, each of which has an electric bulb 52, are assembled in a matrix to form a display panel 50. Such display units 51 of this display panel 50 can be selected in each group. In this case, a plurality of electric bulbs can also be selected and displayed in each group in the same manner as the case of the memory cells.

As explained above, the plurality of selector-output terminals are divided into two groups ($C_0$ to $C_3$ and $C_4$ to $C_7$ in the above example) in the selector 30. One of the selector-output terminals is selected from each of the groups, and a pair of the selector-output terminals is determined as a minimum unit to be selected. By using this minimum unit, a larger number of selection can be made as compared to the number of selector-output terminals.

When the selector 30 is used especially as an address decoder in the structure of memory cells in a matrix, a selection output terminal from which a selection signal is output may also be provided in the selector 30. There are required a selector-output signal that selects a word line in the row direction and a selector-output signal that selects a bit line in the column direction on the matrix. When these selector-output signals are alternately output from a selector-output terminal, the selection signal is output to identify whether the selector-output signal that is currently output is for selection of a word line or a bit line.

Figure 6:
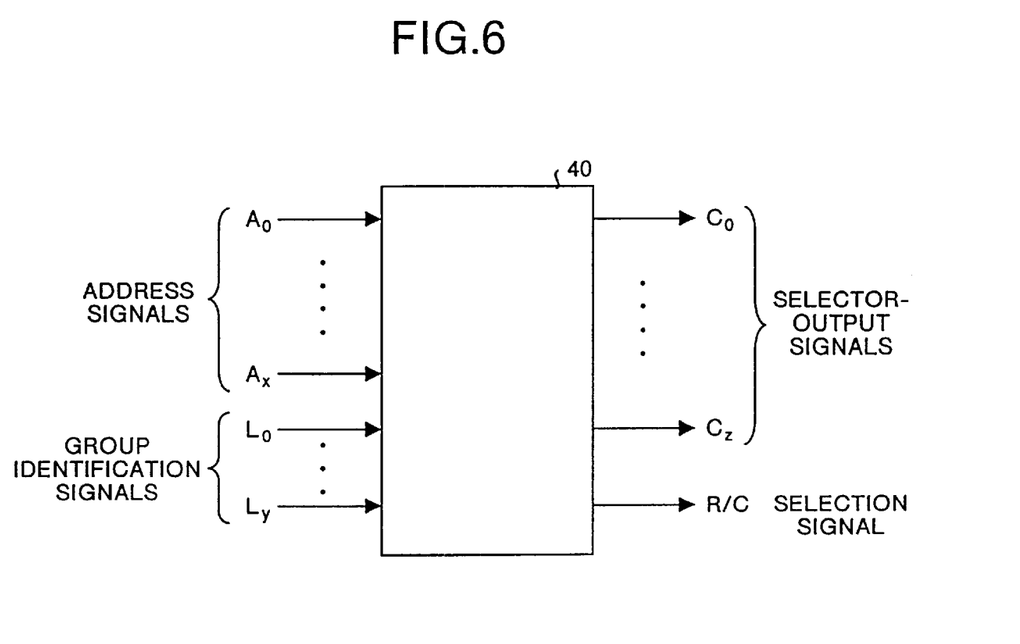
FIG. 6 shows a selector in which a selection output terminal is provided to output a selection signal R/C.

FIG. 6 shows a selector in which the selection output terminal is provided to output this selection signal R/C. In FIG. 6, the group identification signals $L_0$ to $L_y$, the address signals $A_0$ to $A_x$, and the selector-output signals $C_0$ to $C_z$ are the same as those in the selector 10 shown in FIG. 1. Therefore, explanation of the signals is omitted.

This selector 40 alternately outputs the selector-output signal for selection of a word line and the selector-output signal for selection of a bit line from the same selector-output terminal based on time division. This configuration is like a multiplex system which is usually used in a memory system with a DRAM (Dynamic Random Access Memory).

The device, that receives the selector-output signals $C_0$ to $C_z$ output from the selector-output terminal, is required to know which of the selector-output signals $C_0$ to $C_z$ is output.

Therefore, the selector outputs a selection signal R/C that indicates such information signal.

By providing the selection output terminal that outputs a selection signal R/C in the selector as explained above, the limited number of selector-output terminals can be made effective use of. Thus, it is possible to select one or any group of a larger number of objects to be selected.

According to the selector 30 based on the second embodiment as explained above, the selector-output terminals are divided into two groups for the memory cells in a matrix. The two groups are used for selection of a word line in the row direction and selection of a bit line in the column direction. One selector-output terminal is then selected from each of the divided groups, or a plurality of selector-output terminals are selected in each group as explained in the first embodiment. The selector-output signal is then output as an effective signal from the selected selector-output terminal. Thus, it is possible to perform selection to a larger number of objects to be selected (memory cells in the example) as compared to the number of selector-output terminals through outputting of the effective signal.

Further, according to the selector 40, the selection output terminal is provided. This selection output terminal outputs a selection signal to discriminate between selector-output signals that are output based on time division in response to input of the address signals $A_0$ to $A_x$ based on time division. Therefore, it is possible to select one or any group of a larger number of objects to be selected by making effective use of the limited number of selector-output terminals.

Although the case of the memory system has been explained, this invention does not restrict the object only to the memory. This invention is also applicable to a system such that it is desirable to select elements forming the system in each group. Such system includes a display unit formed with a large number of light-emitting devices and an assembly of control devices each of which controls each group.

The selector according to one aspect of this invention comprises a plurality of selector-output terminals that are objects to be selected and a plurality of address terminals that select these selector-output terminals. The selector further comprises a plurality of group identification terminals that divide the selector-output terminals into groups, and enable selection of the selector-output terminals in each group. Therefore, it is possible to output effective signals from a plurality of selector-output terminals at a time based on the address signals that are input into the address terminals and the group identification signals that are input into the group identification terminals. Accordingly, the signals in the same level can be output selectively and concurrently from a plurality of selector-output terminals only by specifying one address. Further, it is possible to reduce the load on the controller (such as a CPU) that gives signals to a selector in any system that has this selector and also improve the throughput of the entire system.

The selector according to another aspect of this invention comprises a plurality of selector-output terminals that are objects to be selected and a plurality of address terminals that select these selector-output terminals. The selector further comprises a plurality of group identification terminals that divide the selector-output terminals into groups, and enable selection of the selector-output terminals in each group. In addition, there is provided a selection output terminal that outputs a selection signal to discriminate between selector-output signals that are output from the selector-output terminal. Therefore, it is possible to select one or any group of a larger number of objects to be selected by making effective use of the limited number of selector-output terminals.

Further, a particular selector-output terminal of the plurality of selector-output terminals is specified with addresses finally obtained by the following steps. The plurality of selector-output terminals are divided into a plurality of groups with a first division unit. An address is then assigned to each of the divided groups that identifies the corresponding group. The groups divided with the first division unit are further divided into a plurality of groups with a second division unit. Further, an address is assigned to each of the groups divided in the second division unit that identifies a corresponding group. The division and assignment of addresses to each of the divided groups is repeated for a specific number of times. Therefore, a plurality of selector-output terminals can be selected by specifying addresses of larger and smaller groups. In addition, effective selector-output signals can concurrently be output from these selected selector-output terminals.

Further, a particular selector-output terminal of the plurality of selector-output terminals is specified with addresses finally obtained by the following steps. Namely, the plurality of selector-output terminals are divided into groups each of which includes one quarter of the terminals. 2-bit addresses of "00", "01", "10", and "11" are then assigned to the divided groups, and the divided groups are again divided into groups each of which includes one quarter of the total number of group. Further, 2-bit addresses of "00", "01", "10", and "11" are assigned to each of the divided groups. The division and assignment of addresses to each of the divided groups is repeated for a specific number of arbitrary times. Thus, the address can be represented as a 2-bit code corresponding to a relative location of each of the areas divided by four, which allows handling of the addresses to be easier.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A selector comprising:
   a plurality of address terminals;
   a plurality of selector-output terminals; and
   a plurality of group identification terminals which receive group identification signals that contain information about a number of divisions into which said selector-output terminals are to be divided into groups,
   wherein, of the groups divided based on the number of divisions specified by the group identification signals, the group specified with the address signals is selected based on the group identification signals that are input from said group identification terminals and the address signals that are input from said address terminals, and the selector-output signal that is to be output from thee selector-output terminal within the selected group is made effective.

2. The selector according to claim 1, wherein a particular selector-output terminal of said plurality of selector-output terminals is specified with addresses obtained by,
   dividing said plurality of selector-output terminals into a plurality of groups in a first division unit,
   assigning an address that identifies a corresponding group to each of the divided groups,
   further dividing each of the groups divided in the first division unit into a plurality of groups in a second division unit,
   assigning an address that identifies a corresponding group to each of the groups divided in the second division unit,
   repeating division of groups and assignment of addresses to the divided groups for a specified number of times,
   wherein the group identification signal is a signal that specifies the number of divisions, and
   wherein the address signal is a signal that specifies one of the addresses that are assigned to the divided groups.

3. The selector according to claim 1, wherein a particular selector-output terminal of said plurality of selector-output terminals is specified with addresses obtained by,
   dividing said plurality of selector-output terminals into groups each of which includes one quarter of the terminals,
   assigning 2-bit addresses of "00", "01", "10", and "11" to the divided groups,
   further dividing each of the divided groups into groups each of which includes one quarter of the group,
   further assigning 2-bit addresses of "00", "01", "10", and "11" to each of the divided groups, and
   repeating division of groups and assignment of addresses to the divided groups for a specified number of times,
   wherein the group identification signal is a signal that specifies the number of divisions, and
   wherein the address signal is a signal that specifies one of the addresses that are assigned to the divided groups.

4. A selector comprising:
   a plurality of address terminals;
   a plurality of selector-output terminals;
   a plurality of group identification terminals which receive group identification signals that contain information about a number of divisions into which said selector-output terminals are to be divided into groups; and
   a selection output terminal which outputs a selection signal that identifies the selector-output signals that are output from said selector-output terminal,
   wherein, of the groups divided based on the number of divisions specified by the group identification signals, the group specified with the address signals is selected based on the group identification signals that are input from said group identification terminals and the address signals that are input from said address terminals, and the selector-output signal that is to be output from the selector-output terminal within the selected group is made effective, and a selection signal that identifies the selector-output signals that are output in response to input of the address signals is output from said selection output terminal.

5. The selector according to claim 4, wherein a particular selector-output terminal of said plurality of selector-output terminals is specified with addresses obtained by,
   dividing said plurality of selector-output terminals into a plurality of groups in a first division unit,
   assigning an address that identifies a corresponding group to each of the divided groups,
   further dividing each of the groups divided in the first division unit into a plurality of groups in a second division unit,
   assigning an address that identifies a corresponding group to each of the groups divided in the second division unit,
   repeating division of groups and assignment of addresses to the divided groups for a specified number of times, wherein the group identification signal is a signal that specifies the number of divisions, and wherein the address signal is a signal that specifies one of the addresses that are assigned to the divided groups.

6. The selector according to claim 4, wherein a particular selector-output terminal of said plurality of selector-output terminals is specified with addresses obtained by, dividing said plurality of selector-output terminals into groups each of which includes one quarter of the terminals, assigning 2-bit addresses of "00", "01", "10", and "11" to the divided groups, further dividing each of the divided groups into groups each of which includes one quarter of the group, further assigning 2-bit addresses of "00", "01", "10", and "11" to each of the divided groups, and repeating division of groups and assignment of addresses to the divided groups for a specified number of times, wherein the group identification signal is a signal that specifies the number of divisions, and wherein the address signal is a signal that specifies one of the addresses that are assigned to the divided groups.

* * * * *